(12) United States Patent
Lim

(10) Patent No.: US 7,732,283 B2
(45) Date of Patent: Jun. 8, 2010

(54) FABRICATING METHOD OF SEMICONDUCTOR DEVICE

(75) Inventor: Hyun Ju Lim, Mapo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 442 days.

(21) Appl. No.: 11/876,069

(22) Filed: Oct. 22, 2007

(65) Prior Publication Data

US 2008/0160691 A1 Jul. 3, 2008

(30) Foreign Application Priority Data

Dec. 27, 2006 (KR) .................. 10-2006-0135602

(51) Int. Cl.
*H01L 21/336* (2006.01)
(52) U.S. Cl. .................. 438/279; 438/303; 438/305; 438/595; 257/E21.64
(58) Field of Classification Search .......... 438/303, 438/305, 595, 279; 257/E21.64
See application file for complete search history.

(56) References Cited

U.S. PATENT DOCUMENTS

| 5,972,764 | A  | * | 10/1999 | Huang et al. | ............... 438/305 |
| 6,265,274 | B1 | * | 7/2001  | Huang et al. | ............... 438/305 |
| 6,346,468 | B1 | * | 2/2002  | Pradeep et al. | ............. 438/595 |
| 7,064,071 | B2 | * | 6/2006  | Schwan | .................... 438/303 |
| 7,217,626 | B2 | * | 5/2007  | Bu et al. | ................... 438/303 |

\* cited by examiner

*Primary Examiner*—Michael Trinh
(74) *Attorney, Agent, or Firm*—Saliwanchik, Lloyd & Saliwanchik

(57) ABSTRACT

A method of fabricating a semiconductor device is provided. Spacers can be formed on adjacent gate structures and used as an ion implantation mask for forming source/drain regions. The spacers can include a nitride layer and an oxide layer. An etch stop layer can be provided between the gate structures, and the oxide layer can be removed from the spacers. A first oxide layer formed below the nitride layer can be protected from being etched away during removal of the oxide layer from the spacers by the etch stop layer. The etch stop layer and the first oxide layer can be removed, and an interlayer dielectric layer can be deposited.

10 Claims, 3 Drawing Sheets

FABRICATING METHOD OF SEMICONDUCTOR DEVICE

CROSS-REFERENCE TO RELATED APPLICATION

The present application claims the benefit under 35 U.S.C. §119 of Korean Patent Application No. 10-2006-0135602, filed Dec. 27, 2006, which is hereby incorporated by reference in its entirety.

BACKGROUND

Recently, as a design rule of a semiconductor device becomes smaller, the integration degree of a semiconductor device is largely increased.

As the design rule of the semiconductor device becomes smaller, the chip size and the circuit line width of the semiconductor device become gradually smaller and various problems occur.

As one of the problems, the gap between gate structures included in the semiconductor device become narrow so that the aspect ratio of the gap formed between the gate structures is increased, thereby frequently generating a void between the gate structures when forming an interlayer dielectric layer covering the gate structures.

The problem where a void is generated between gate structures frequently occurs in a NOR-type flash memory device having a cell array area where a plurality of memory cells are connected to one bit line in parallel.

Since the bit line is arranged between a pair of neighboring gate structures, the NOR-type flash memory device frequently generates the void at a position where the bit line is formed.

BRIEF SUMMARY

Embodiments of the present invention provide a method of fabricating a semiconductor device. According to an embodiment, voids can be inhibited from forming in an interlayer dielectric layer between adjacent gate structures.

A fabricating method of a semiconductor device according to one embodiment comprises: forming a first gate and a second gate adjacent the first gate on a semiconductor substrate; sequentially forming a first oxide film, a nitride film, and a second oxide film covering the first and second gates; forming spacers on the first oxide film on sidewalls of the first and the second gates by selectively etching back the second oxide film and the nitride film, wherein each spacer includes a nitride pattern and a second oxide film pattern; forming a source/drain on the semiconductor substrate using the spacers as an ion implant mask; forming an etch stop pattern between the first and second gates so as to inhibit the etching of the first oxide film exposed between the spacers; removing the second oxide pattern from the spacers; removing the etch stop pattern; and etching the first oxide film exposed from the spacers.

Other systems, methods, features and advantages will be, or will become, apparent to one with skill in the art upon examination of the following figures and detailed description. Nothing in this section should be taken as a limitation on those claims. Further aspects and advantages are discussed below in conjunction with the embodiments.

BRIEF DESCRIPTION OF THE DRAWING

FIG. 1 is a cross-sectional view showing insulating layers, and polysilicon layers on a semiconductor substrate according to an embodiment;

FIG. 2 is a cross-sectional view showing a first gate and a second gate according to an embodiment;

FIG. 3 is a cross-sectional view showing a formation of a triple insulating layer covering the first and second gates shown in FIG. 2;

FIG. 4 is a cross-sectional view showing a gate spacer according to an embodiment;

FIG. 5 is a cross-sectional view showing an etch stop pattern covering the exposed oxide film shown in FIG. 4;

FIG. 6 is a cross-sectional view after removal of oxide film patterns of the first and second spacers shown in FIG. 5; and FIG. 7 is a cross-sectional view showing an interlayer dielectric layer and a bit line on the semiconductor substrate shown in FIG. 6.

DETAILED DESCRIPTION

While a fabricating method of a semiconductor device according to the embodiment will now be described, the embodiments are not limited thereto. It would be appreciated by those skilled in the art that changes might be made in this embodiment without departing from the principles and spirit of the invention.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

FIGS. 1 to 7 are cross-sectional views showing a fabricating method of a semiconductor device according to one embodiment of the present invention.

Figure 1:
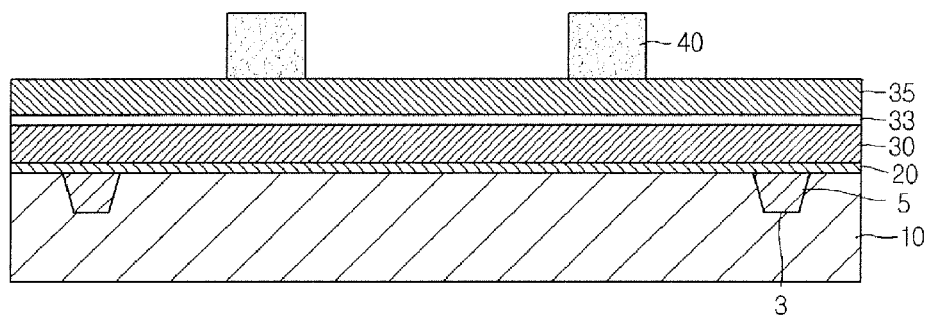
FIGS. 1-7 show a method of fabricating a semiconductor device according to an embodiment of the present invention.

Referring to FIG. 1, a device isolating pattern 5 can be formed on a semiconductor substrate 10.

In one embodiment, in order to form the device isolating pattern 5, the semiconductor substrate 10 can be provided with a trench 3 and the inside of the trench 3 is filled with oxide to form the device isolating pattern 5.

After the device isolating pattern 5 is formed, a gate insulating layer 20 can be formed over the semiconductor substrate 10. In an embodiment, the gate insulating layer 20 can be formed by oxidizing the semiconductor substrate 10.

After the gate insulating layer 20 is formed, a floating polysilicon layer 30 can be formed covering the gate insulating layer 20.

After forming the floating polysilicon layer 30, an oxide-nitride-oxide (ONO) layer 33 can be formed on the floating polysilicon layer 30, and a control polysilicon layer 35 can be formed on the ONO layer 33.

After the control polysilicon layer 35 is formed, a photoresist film can be coated over the control polysilicon layer 35, and patterned by means of a photo process including an exposure process and a developing process to form a photoresist pattern 40 for a gate.

Figure 2:
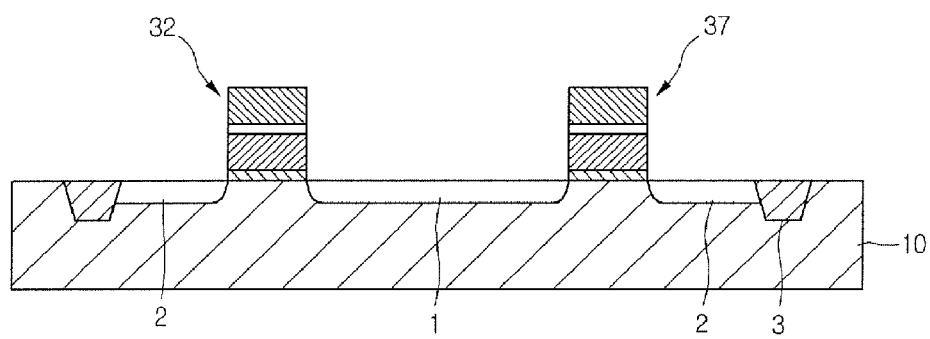

Referring to FIG. 2, the control polysilicon layer 35, the ONO layer 33, the floating polysilicon layer 30, and the gate insulating layer 20 can be patterned using the photoresist pattern 40 as an etch mask so that a first gate 32 and a second gate 37 are formed on the semiconductor substrate 10.

Impurity can be implanted into the semiconductor substrate 10 at low concentration using the first gate 35 and the second gate 37 as an ion implant mask to form a low-concentration source 2 at a side of each of the first and second gates 32 and 37 and a low-concentration common drain 1 between the first and second gates 32 and 37.

Figure 3:
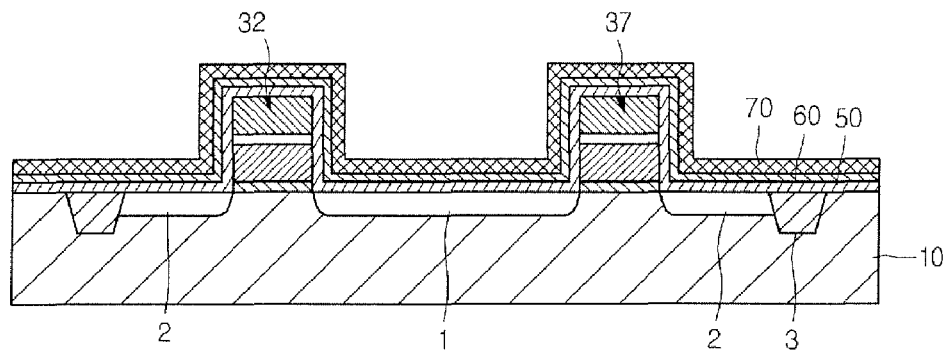

Referring to FIG. 3, after the low-concentration source 2 and the low-concentration common drain 1 are formed on the semiconductor substrate 10, a triple insulating layer covering the first gate 32 and the second gate 37 can be formed on the semiconductor substrate 10.

Specifically, in one embodiment, the triple insulating layer can include a first oxide film 50 contacting the first gate 32 and the second gate 37, a nitride film 60 formed on the oxide film 50, and a second oxide film 70 formed on the nitride film 60.

According to an embodiment, the first oxide film 50 can have a first thickness and the second oxide film 70 can have a second thickness thicker than the first thickness. In one embodiment, the first thickness of the oxide film 50 is about 150 Å to about 300 Å, the thickness of the nitride film 60 is about 100 Å to about 300 Å, and the thickness of the second oxide film is about 500 Å to about 800 Å. The first oxide film 50 and the second oxide film 70 can be a TEOS film.

Figure 4:
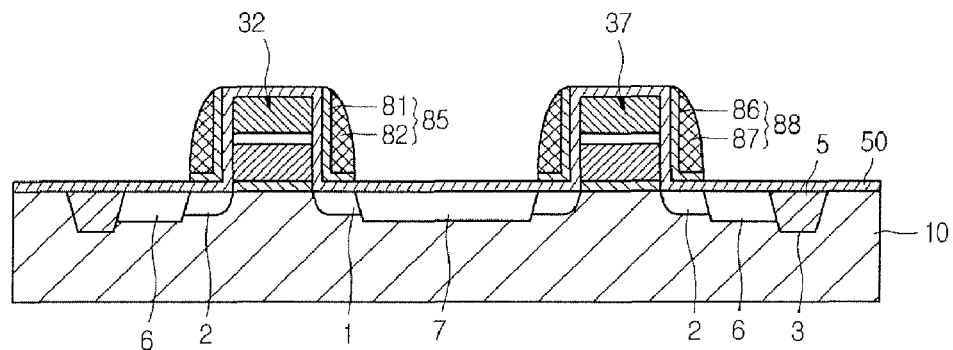

Referring to FIG. 4, the nitride film 60 and the second oxide film 70 can be etched by means of an etch-back process so that a portion of the oxide film 50 on the first and the second gates 32 and 37 and between the first and second gates 32 and 37 is exposed.

In one embodiment, the etch-back etching process uses HBr gas, C-12 gas, and oxygen gas as a source gas.

A process condition for the etch-back process can include, pressure of about 100 mT to about 130 mT, power for a dry etch of about 200 W to about 300 W, flux of C-12 gas of about 100 sccm to about 150 sccm, flux of HBr gas of about 10 sccm to 50 sccm, flux of oxygen gas of about 5 sccm to about 10 sccm, and process progressing time of about 10 to about 50 seconds.

According to the process condition as described above, the second oxide film 70 and the nitride film 60 are etched by means of the etch-back to form a first and second spacers 85 and 88 on the first and second gates 32 and 37 on the first oxide film 50, and the first oxide film 50 is not etched by means of the etch-back.

Accordingly, the first spacer 85 comprises a first nitride film pattern 81 from the nitride film 60 and a first oxide film pattern 82 from the second oxide film 70. The second spacer 88 comprises a second nitride pattern 86 from the nitride film 60 and a second oxide film pattern 87 from the second oxide film 70.

Subsequently, the semiconductor substrate 10 can be implanted with impurity ions at high concentration using the first and second spacers 85 and 88 as the ion implant mask to form a high-concentration source 6 and a high concentration common drain 7.

Figure 5:
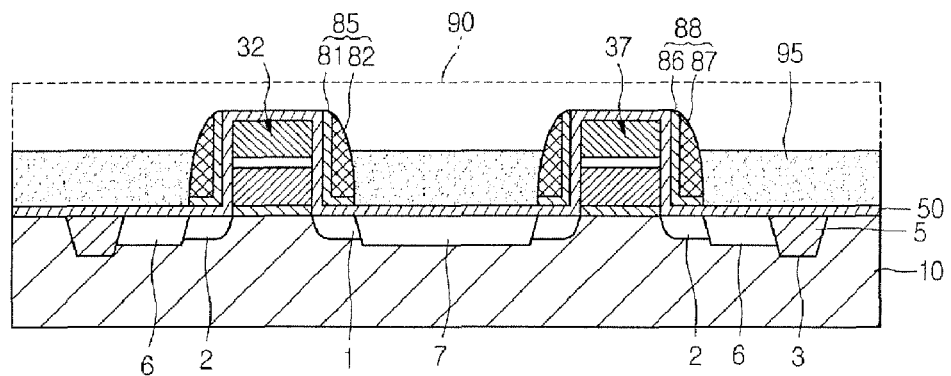

Referring to FIG. 5, an etch stop layer 90 covering the substrate 10, including the first and second spacers 85 and 88 can be formed. In one embodiment, as an example of the material usable as the etch stop layer, novolak resin can be used. The etch stop layer 90 can be provided at height substantially covering the first and second spacers 85 and 88 of the semiconductor substrate 10.

The etch stop layer 90 inhibits the oxide film 50 not protected by means of the first and second spacers 85 and 88 from being etched.

After the etch stop layer 90 is formed, the etch stop layer 90 can be etched by an etch-back process so that an etch stop pattern 95 is formed on the semiconductor substrate 10. In one embodiment, the etch stop pattern 95 has a thickness of about half of the height of the first and second spacers 85 and 88.

Figure 6:
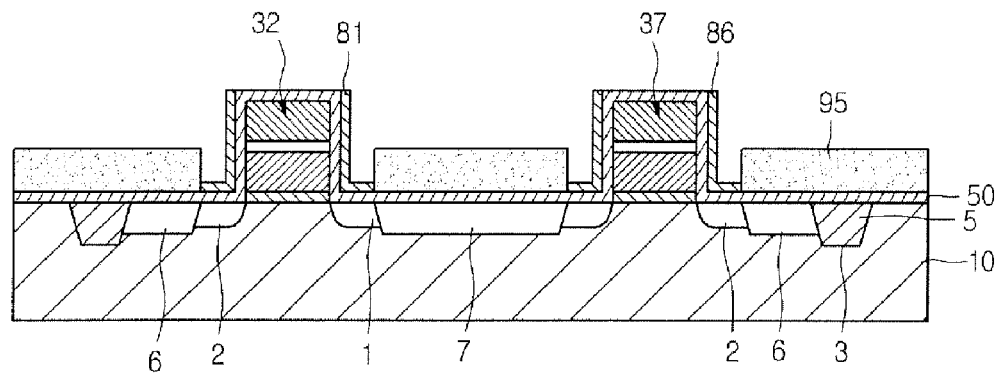

Referring to FIG. 6, the first oxide film pattern 82 and the second oxide film pattern 87 of the first and second spacers 85 and 88 can be removed. At this time, the first oxide film pattern 82 and the second oxide film pattern 87 can be wet-etched by means of BHF solution so that they are removed.

Removing the first oxide film pattern 82 and the second oxide pattern 87 by means of the wet etch scheme expands a gap between the gate structures so that in a subsequent PMD gap fill process a generation of a void between the gate structures can be inhibited from occurring. The etch stop pattern 95 inhibits a generation of an undercut due to damage of the exposed oxide 50 during removal of the first oxide pattern 82 and the second oxide pattern 87 so as not to generate the void.

Thereafter, the etch stop pattern 95 can be removed by means of, for example, a wet etch scheme.

After the etch stop pattern 95 is removed, the first oxide film 50 not covered by the first and second spacers 81 and 86 can be removed so that the high-concentration sources 6, the high-concentration common drain 7, and the first and second gates 32 and 37 are exposed.

Thereafter, the high-concentration sources 6, the high-concentration common drain 7, and the First and second gate 32 and 37 can be formed with silicide (not shown).

Figure 7:
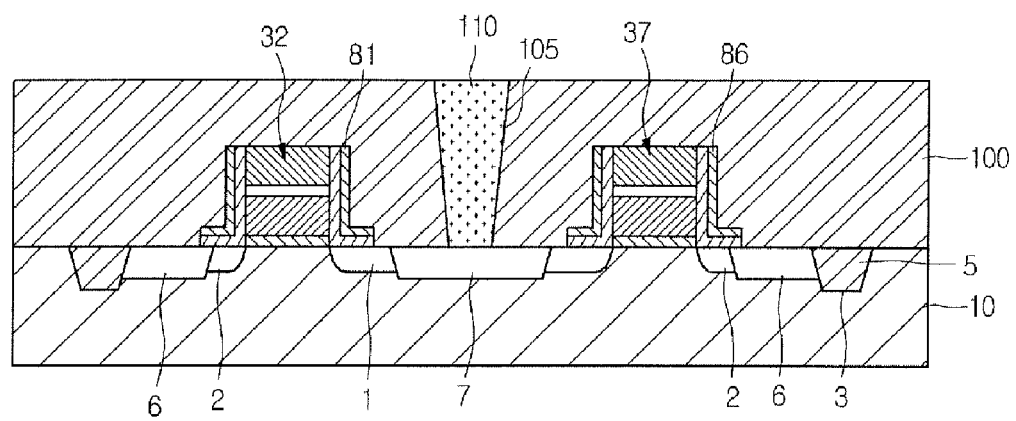

Referring to FIG. 7, an interlayer dielectric layer 100 can be formed on the semiconductor substrate 10. After the interlayer dielectric layer 100 is formed, a contact hole 105 can be formed in the interlayer dielectric layer corresponding to the common high-concentration drain 7, and the contact hole 105 can be formed connected with a bit line 110. In an embodiment, the interlayer dielectric layer 100 can be formed after the exposed oxide film 50 is removed and a silicide is formed.

According to the detailed description, embodiments of the present invention can have an effect of inhibiting a void from being generated between a pair of gate structures with a narrow gap.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A method of fabricating a semiconductor device, comprising:

forming a first gate and a second gate adjacent the first gate on a semiconductor substrate;

sequentially forming a first oxide film, a nitride film, and a second oxide film on the semiconductor substrate including the first gate and the second gate;

performing an etch-back process on the second oxide film and the nitride film to form spacers;

forming a etch stop pattern between the first gate and the second gate such that the first oxide film is not exposed between the spacers of the first gate and the second gate;

removing the second oxide film from the spacers;

removing the etch stop pattern; and etching the first oxide film exposed by the spacers.

2. The method according to claim 1, wherein forming the etch stop pattern comprises:

forming an etch stop layer covering the semiconductor substrate including the spacers; and etching the etch stop layer using an etch-back process.

3. The method according to claim 2, wherein the etch stop pattern covers the first oxide film between the first gate and the second gate, and wherein the etch stop layer is etched to a height lower than the height of the spacers.

4. The method according to claim 2, wherein the etch stop layer comprises novolak resin.

5. The method according to claim 1, wherein the first oxide film and the second oxide film each comprise a TEOS film.

6. The method according to claim 1, wherein the first oxide film is formed thinner than the second oxide film.

7. The method according to claim 1, wherein removing the second oxide film, comprises wet-etching using BHF solution.

8. The method according to claim 1, further comprising forming an interlayer dielectric layer of PMD material between the spacers after etching the first oxide film.

9. The method according to claim 1, further comprising forming source/drain regions using the spacers formed of the nitride film and the second oxide film as an ion implant mask.

10. The method according to claim 1, wherein the first gate and the second gate each comprise a gate dielectric pattern, floating gate pattern, oxide-nitride-oxide layer pattern, and control gate pattern.

* * * * *